United States Patent [19]

Tamura et al.

[11] Patent Number: 5,897,923
[45] Date of Patent: Apr. 27, 1999

[54] PLASMA TREATMENT DEVICE

[75] Inventors: Takahiro Tamura, Hachiouji; Junro Sakai, Tokyo, both of Japan

[73] Assignee: Anelva Corporation, Tokyo, Japan

[21] Appl. No.: 08/536,709

[22] Filed: Sep. 29, 1995

[30] Foreign Application Priority Data

Sep. 30, 1994 [JP] Japan .................................. 6-261619

[51] Int. Cl.$^6$ .......................... C23C 16/40; C23C 16/52; H05H 1/11
[52] U.S. Cl. ................................. 427/571; 118/723 MA; 315/111.71; 427/579
[58] Field of Search ................................... 427/452, 571, 427/579; 118/723 MP, 723 MR, 723 MA, 723 IR; 156/345; 216/67, 68, 70; 315/111.71; 438/711, 719, 728, 731, 732, 788, 792

[56] References Cited

U.S. PATENT DOCUMENTS

| | | | |
|---|---|---|---|
| 5,427,621 | 6/1995 | Gupta | 134/1 |
| 5,429,070 | 7/1995 | Campbell et al. | 118/723 R |
| 5,522,936 | 6/1996 | Tamura | 118/723 R |
| 5,565,247 | 10/1996 | Suzuki | 427/562 |
| 5,605,637 | 2/1997 | Shan et al. | 216/71 |
| 5,662,819 | 9/1997 | Kadomura | 438/711 |

*Primary Examiner*—Jeffrey E. Russel
*Attorney, Agent, or Firm*—Edward D. Manzo; Cook, McFarron & Manzo, Ltd.; Mark J. Murphy

[57] ABSTRACT

A plasma treatment device for forming a high-quality thin film with fewer surface flaws and etching by preventing the generation of fine powders from deposited films in a film-forming chamber, by means of plasma treatment using gaseous starting materials. The plasma treatment chamber device includes a plasma generation chamber 11, a power-supplying mechanism for supplying power to this chamber, a film-forming chamber 113 to be spatially connected to the plasma generation chamber 11, a magnetic field generation mechanism 14 provided around this film-forming chamber for forming a multicusp magnetic field therein, an evacuation mechanism for evacuating the chamber, a first gas-supplying mechanism 16 for supplying gaseous starting materials and a second gas-supplying mechanism 17 for supplying gaseous materials for forming films. An inner wall surface 113b of the film-forming chamber is located in an area having a multicusp magnetic field with an intensity of from 50 to 200 G. Alternatively, instead of the inner wall surface 113b, a member 61 formed a nonmagnetic material can be located within the film-forming chamber.

16 Claims, 12 Drawing Sheets

(A) Example of combining cylindrical body and truncated cone (B) Example of combining cylindrical body and truncated cone (C) Example of combining cylindrical body and truncated cone (D) Bottomed cylindrical body (E) Example of combining bottomed cylindrical body and truncated cone

PLASMA TREATMENT DEVICE

BACKGROUND OF THE INVENTION

1. Field of the Invention

The present invention is directed to a plasma treatment device. In particular, the invention is directed to a plasma treatment device for a thin film formation process (plasma-assisted CVD and sputtering) or etch process utilizing the effect of plasma when manufacturing integrated circuits.

2. Description of the Related Art

An example of conventional plasma treatment devices will be described with reference to FIG. 12.

The plasma treatment device of FIG. 12 is a plasma-assisted CVD apparatus for forming silicon dioxide films. The device uses oxygen gas ($O_2$) as a gaseous starting material for plasma generation and monosilane gas ($SiH_4$) as a gaseous material for thin film formation. The silicon dioxide films produced are substantially the same as thermal oxidated films in terms of quality.

The plasma-assisted CVD apparatus shown in FIG. 12 is provided with a bell jar 11 used for plasma generation, a power-supplying mechanism 12 for supplying power to bell jar 11, a film-forming chamber 13 spatially connected to bell jar 11, a magnetic field generation mechanism 14 located around film-forming chamber 13 for forming a multicusp magnetic field therewithin, an evacuation mechanism 15 for evacuating bell jar 11 and chamber 13, a first gas-supplying mechanism 16 for supplying oxygen gas to chamber 13, and a second gas-supplying mechanism 17 for supplying the monosilane gas.

In this plasma-assisted CVD apparatus, bell jar 11, which is formed of a dielectric material, functions as a plasma generation chamber. More specifically, the upper end of bell jar 11, having a diameter of 100 mm when closed, is made of a quartz glass tube while the open lower end of the bell jar is connected to film-forming chamber 13. Power-supplying chamber 12 consists of a high frequency power source 21, a matching box 22, and a loop-shaped antenna 23 arranged around bell jar 11. High frequency power source 21 has a high frequency power of, for example, 13.56 MHz. However, a power source other than one limited to supplying high-frequency power could be used. Film-forming chamber 13 is formed of a cylindrical aluminum alloy and has, for example, a height of 230 mm and an inner diameter of 360 mm. Magnetic field generation mechanism 14 is arranged around film-forming chamber 13 and is formed of a rare-earth permanent magnet having 12 pairs of 24 poles. It is for the purpose of generating large-diameter and uniform plasma in film-forming chamber 13 that the multicusp magnetic field is formed therewithin by magnetic field generation mechanism 14.

Evacuation mechanism 15 consists of an evacuation chamber 31, two stage valves 32a and 32b, and an evacuation pump 33. The evacuation pump 33 has a turbo molecular pump 33a as the main evacuation pump and a dry pump 33b as a back-up evacuation pump.

Inside film-forming chamber 13 is a substrate holder 42 for supporting a substrate 41. Substrate holder 42 includes a structure 43, for circulating a thermo-exchanging medium, with a temperature detector therein (not shown in FIG. 12). Thus, substrate holder 42 is capable of controlling temperatures by heating or cooling to a specified temperature. A high-frequency power source 44 is connected to holder 42 so as to apply biased voltage to substrate 41. High-frequency power source 44 has a high frequency power of, for example, 400 kHz.

FIG. 13 is a sectional view along line A—A in FIG. 12. Outside the cylindrical wall part 13a of film-forming chamber 13 is a bar-shaped permanent magnet 51, having 12 pairs of 24 poles, arranged along the outer wall surface. The permanent magnet 51, having polarity of 12 pairs of 24 poles, is one of the components of the magnetic field generation mechanism 14. Magnet 51 is placed in parallel with the axial direction of the cylindrical wall part 13a. A pair of faces of magnet 51 is opposed to the outer wall surfaces of chamber 13 and is made of magnetic poles N and S, which are alternately arranged along the circumferential directions of the outer wall surfaces of chamber 13. A multicusp magnetic field 52 as shown in FIG. 13 is formed in the inner space of film-forming chamber 13 by magnet 51. Oxygen plasma coming into chamber 13 is difused along the configuration of the multicusp magnetic field 52 therein. The oxygen plasma is then brought into contact with the inner wall surface 13b of cylindrical wall part 13a of chamber 13 corresponding to the respective polar surfaces (N and S) of magnet 51 reflecting the configuration of the multicusp magnetic field 52.

As described above, the conventional plasma treatment device is constructed in such a way that the multicusp magnetic field 52 is generated in film-forming chamber 13 by means of the magnetic field generation mechanism 14 arranged around chamber 13. With the multicusp magnetic field 52, there are places 53 on surface 13b with which the oxygen plasma will come into contact and places 54 with which it will not. As a result, silicon dioxide thin films deposited on inner wall surface 13b may have differences in quality and thickness depending on the place on the inner wall surface where the film is formed. In other words, dense films, which are close to thermal oxidated films in quality, will be formed on the places 53 of inner wall surface 13b with which the oxygen plasma comes into contact since they receive charged particles from the plasma. On the other hand, as compared with places 53, rougher films will be formed on places 54 where the oxygen plasma does not come into contact. Consequently, using the conventional plasma treating devices will result in silicon dioxide films, having differences in density and in internal stress, being deposited and formed on inner wall surface 13b of film-forming chamber 13.

If silicon dioxide thin films continue to be deposited and formed on inner wall surface 13b of film-forming chamber 13 in the state described above, sooner or later, the thin films will peel off and fall from surface 13b due to the differences in internal stress. Peeling-off of the thin films will, in turn, cause generation of fine particulates which contaminate the substrate. When silicon dioxide thin films are formed on these contaminated substrates, many surface flaws or defects will be created leading to a deterioration in the quality of the thin films.

SUMMARY OF THE INVENTION

It is the object of the present invention to solve the problems described above by providing a plasma treatment device which is capable of preventing the generation of fine particulates from films deposited and formed on the inner wall surface of a film-forming chamber and carrying out the formation of high-quality thin films or etching of thin films with fewer surface flaws and defects.

In particular, a plasma treatment device according to one aspect of the present invention comprises a plasma generation chamber, a power-supplying mechanism for supplying power to the plasma generation chamber, a film-forming or treating chamber spatially connected to the plasma generation chamber, a magnetic field generation mechanism installed around the film-forming chamber for forming a multicusp magnetic field therein, an evacuation mechanism for evacuating both plasma generation and film-forming chambers, a first gas-supplying mechanism for supplying gaseous starting materials for plasma generation, and a second gas-supplying mechanism for supplying gaseous materials, wherein an inner wall surface of the film-forming chamber is arranged in an area having a multicusp magnetic field with an intensity of from 50 to 200 gauss (G).

In a second embodiment of the plasma treatment device of the present invention, instead of the inner wall surface of the film-forming chamber in the first embodiment, a cylindrical member made of a nonmagnetic material is arranged in the area having a multicusp magnetic field with an intensity of 50 to 200 G.

In a third embodiment, the plasma treating device of the present invention comprises a plasma generation chamber, a power-supplying mechanism for supplying power to the plasma generation chamber, a first magnetic field generation mechanism set around the plasma generation chamber, a film-forming chamber spatially connected to the plasma generation chamber, a second magnetic field generation chamber located around the film-forming chamber for forming a multicusp magnetic field therein, an evacuation mechamism for evacuating both plasma generation and film-forming chambers, a first gas-supplying mechanism for supplying gaseous starting materials for plasma generation, and a second gas-supplying mechanism for supplying gaseous materials wherein the inner wall surface of the film-forming chamber is arranged in an area having a resultant magnetic field with an intensity of from 50 to 200 G made by overlapping the magnetic field formed by the first magnetic field generation mechanism and the multicusp magnetic field.

In a fourth embodiment of the plasma treatment device of the present invention, instead of the inner wall surface of the film-forming chamber of the third embodiment, a cylindrical member made of a nonmagnetic material is arranged in the area having a resultant magnetic field with an intensity of 50 to 200 G.

In a fifth embodiment, the cylindrical member of the fourth embodiment includes a cylindrical member and a truncated conic member.

In a sixth embodiment, the cylindrical member of the second, fourth and fifth embodiments is placed in an electrically insulated state, and high-frequency power is applied thereto.

According to a feature of the present invention, the inner wall surface of the film-forming chamber is placed in the area of either a multicusp magnetic field having an intensity of from 50 to 200 G or the resultant magnetic field made by overlapping the multicusp magnetic field and the one formed by the other magnetic field generation mechanism. This kind of arrangement allows the full surface of the inner wall of the film-forming chamber to be brought into contact with the plasma, which, in turn, makes possible the deposition of films uniform in quality and thickness on the full surface thereof. The deposition of films uniform in quality and thickness makes the internal stress of the films uniform and thereby makes it harder for the deposited films to be peeled off. The generation of such films further prevents the generation of fine particulates from the inner wall surface. A similar effect can be obtained by placing the member made of a nonmagnetic material in the area having a magnetic field, with an intensity of from 50 to 200 G, instead of the inner wall surface of the treating chamber. Further, the use of the nonmagnetic member will not require changes in the form of the treating chamber itself. In addition, the nonmagnetic member can be made in a simple form, and at a low cost, to be adapted to the area having a magnetic field with an intensity of from 50 to 200 G.

BRIEF DESCRIPTION OF THE DRAWINGS

In describing the present invention, reference is made to accompanying drawings, wherein like reference numerals denote like parts, and wherein.

DETAILED DESCRIPTION OF THE PREFERRED EMBODIMENTS

The preferred embodiments of the plasma treatment device of the present invention will be described with reference to the accompanying drawings.

Figure 1:
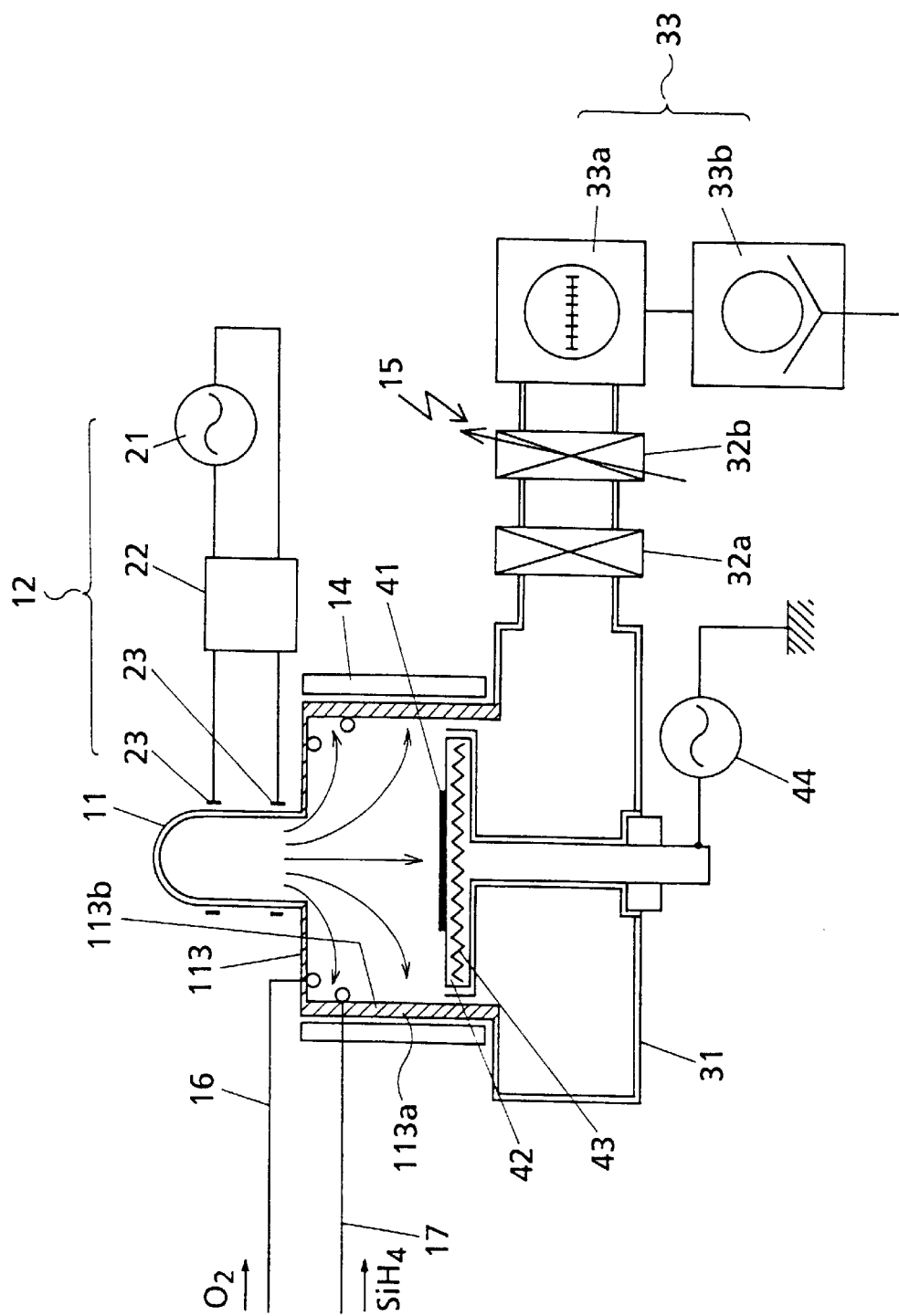
FIG. 1 is a sectional view of the plasma treatment device of the first embodiment of the present invention.

FIG. 1 shows the first embodiment of the plasma treatment device of the present invention. In FIG. 1, the same symbols and reference numbers are used for those elements that are substantially similar to those previously described for FIG. 12.

The plasma treatment device of the present invention is a plasma-assisted CVD treating apparatus. The plasma-assisted CVD apparatus includes a bell jar or plasma generation chamber 11 used for plasma generation, a power-supplying mechanism 12 for supplying high frequency power (RF) to bell jar 11, a film-forming or treating chamber 113 spatially connected to bell jar 11, a magnetic field generation mechanism 14 provided around film-forming chamber 113 for forming a multicusp magnetic field therein, an evacuation mechanism 15 for evacuating bell jar 11 and film-forming chamber 113, a first gas-supplying mechanism 16 for supplying oxygen gas as a gaseous starting material for plasma generation to chamber 113, and a second gas-supplying mechanism 17 for supplying monosilane gas as a gaseous material for thin-:film formation. A substrate holder 42 is located inside film-forming chamber 113 for supporting a substrate 41. A high-frequency (RF) power source 44 is connected to substrate holder 42 so as to apply biased power to substrate 41. The end of second gas-supplying mechanism 17 inside chamber 113 is made of a ring-shaped pipe member.

In this embodiment, oxygen gas is supplied as a gaseous starting material for plasma generation. Oxygen plasma is generated by applying high-frequency (RF) power to the oxygen gas. Through a chemical reaction between the oxygen gas and the monosilane gas, silicon-dioxide thin films will be formed.

For more details on the construction and the procedure for forming thin films, reference is made to the prior summary section. The plasma treatment device of the present invention is, however, not limited to the plasma-assisted CVD apparatus discussed above.

The structure of film-forming chamber 113 of the plasma treatment device in the embodiment shown in FIG. 1 is noteworthy. Inner wall surface 113b of cylindrical wall part 113a is arranged inside an area having a multicusp magnetic field with an intensity of from about 50 to 200 gauss (G). The multicusp magnetic field is formed in chamber 113 by magnetic field generation mechanism 14. Preferably, inner wall surface 113b is placed at a position having an intensity of about 100 G. The diameter of the outer wall surface of cylindrical wall part 113a of chamber 113 is the same as the outer diameter of film-forming chamber 13 of the previously discussed conventional device. Film-forming chamber 113 is made in a cylindrical form having, for example, a height of 230 mm. As the thickness of cylindrical wall part 113a becomes larger, its inner diameter becomes smaller than that of the chamber of the conventional device.

The reasons inner wall surface 113b should preferably be placed in an area having a multicusp magnetic field with an intensity of from about 50 to 200 G formed inside film-forming chamber 113 will be described infra.

Figure 2:
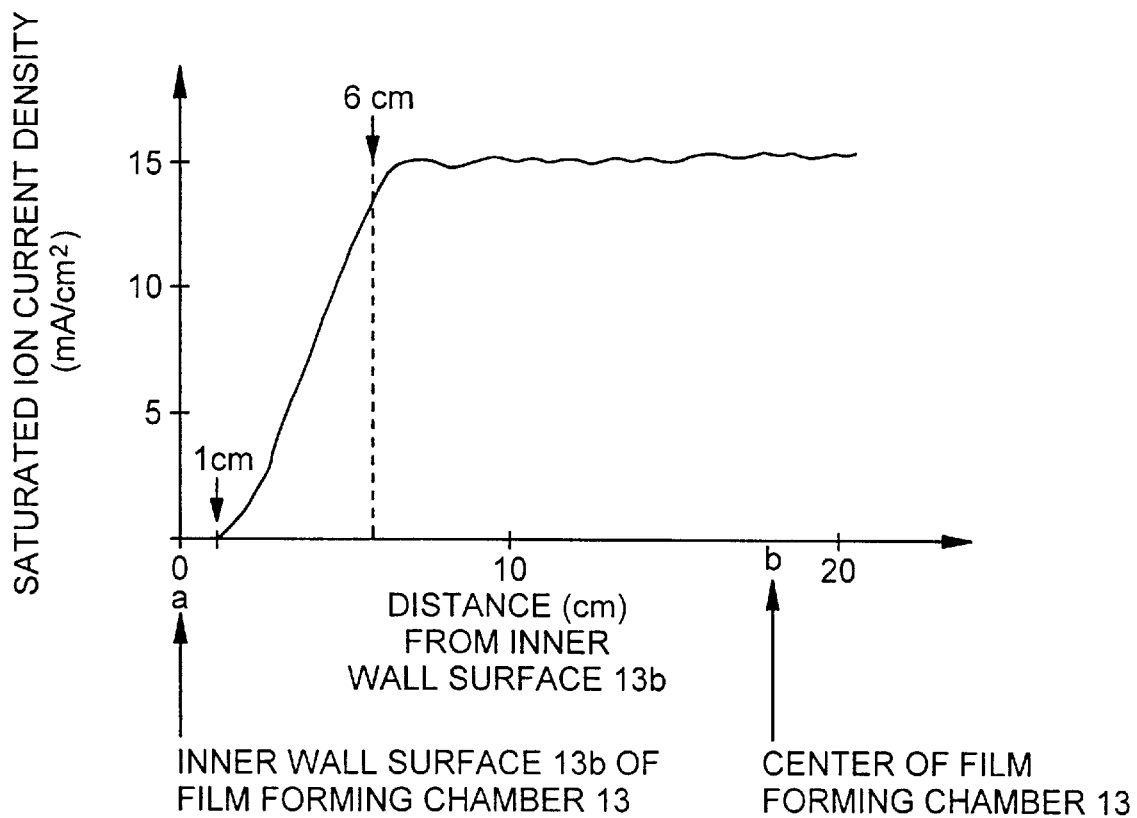
FIG. 2 is graph showing measured changes in the saturated ion-current density of oxygen plasma of the horizontal cross section of the film-forming chamber, located 100 mm below the bell jar, in the conventional plasma treatment device.
Figure 12:
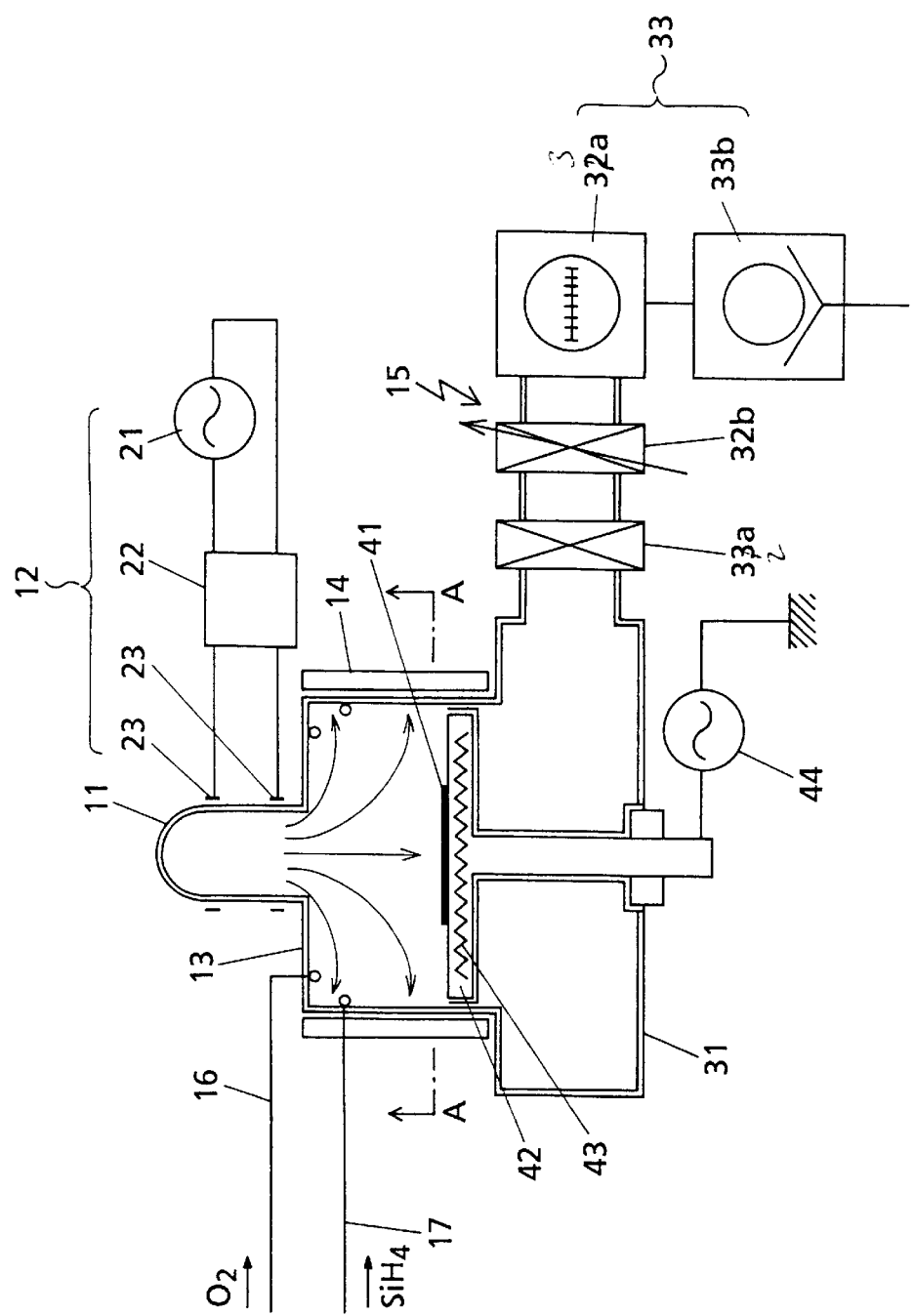
FIG. 12 is a sectional view showing a conventional plasma treatment device for forming thin films.
Figure 13:
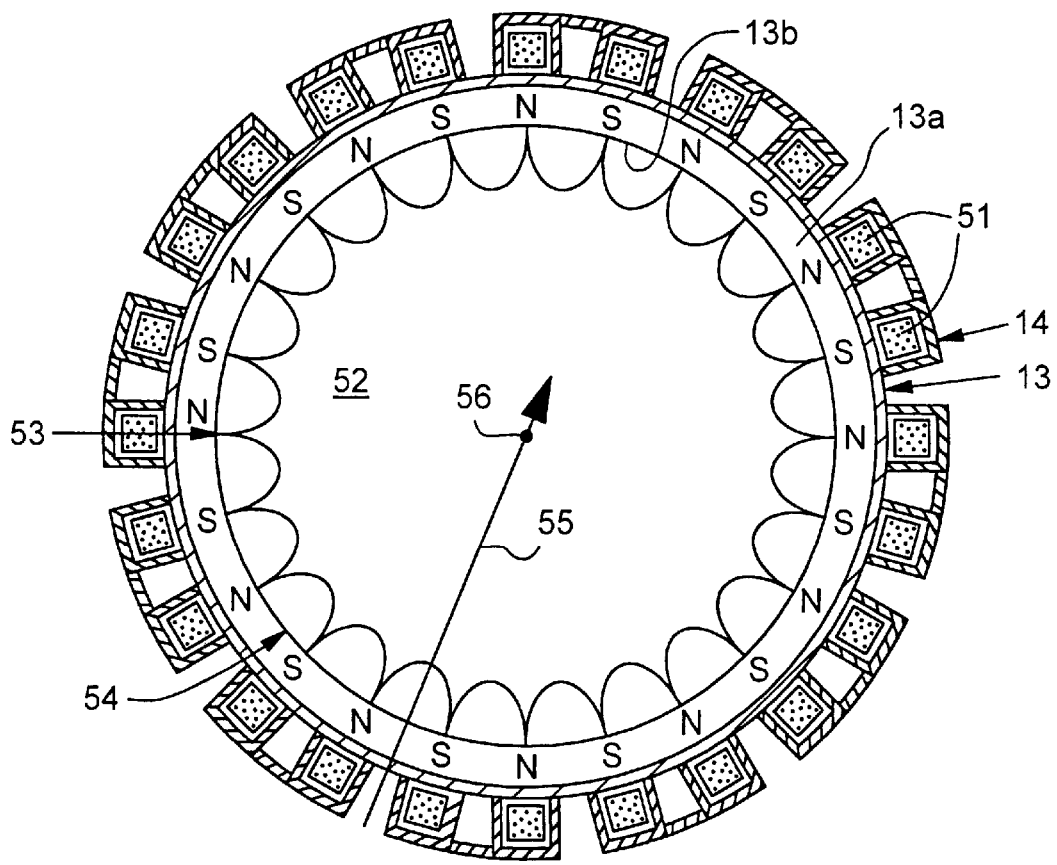
FIG. 13 is a sectional view along line A—A in FIG. 12.

FIG. 2 is a graph showing measured changes in the saturated ion-current density of oxygen plasma of the horizontal cross section inside the film-forming chamber, 100 mm located below bell jar 11, in the conventional plasma treatment device shown in FIG. 12. This measurement was carried out along arrow 55 in FIG. 13. The center of film-forming chamber 13 is indicated by reference number 56. This measurement was made under the following conditions: the frequency of high-frequency power applied to bell jar 11 was 13.56 MHz; the amount of power was 2000 W; and the internal stress on bell jar 11 and chamber 13 was 1 mTorr. In the FIG. 2 graph, the abscissa indicates the distance (cm) from the inner wall surface 13b of chamber 13 while the ordinate indicates a saturated ion-current density. On the abscissa, point (a), at a distance of 0, indicates the position of inner wall surface 13b while point (b), at distance of 18 cm, indicates the position of center 56 of chamber 13. As for the saturated ion-current density indicated on the ordinate, as the value becomes larger, the plasma density becomes higher.

According to the graph in FIG. 2, observation of saturated ion current starts on the inside position, approximately 1 cm from the inner wall surface of film-forming chamber 13. At a position of approximately 6 cm, the current density values become almost constant (15 mAγ. This means that oxygen plasma generated inside chamber 13 will not be brought into contact with the inner wall surface 13b of chamber 13 since it is confined inside an area about 1 cm away from the surface 13b thereof.

Figure 3:
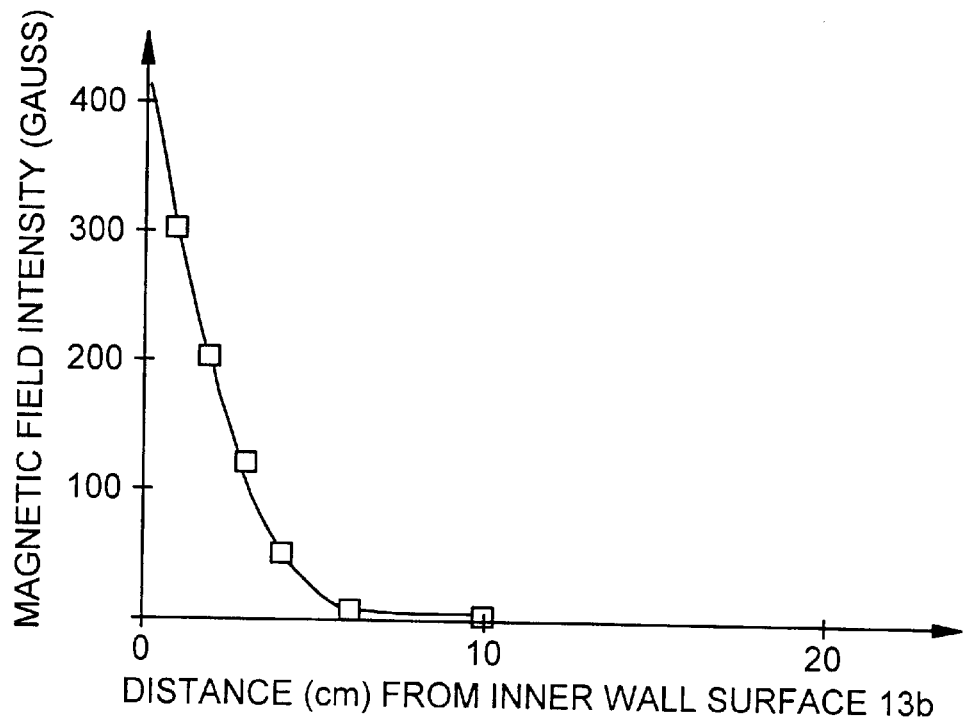
FIG. 3 is a graph showing the intensity of the multicusp magnetic field measured at the same place as the saturated ion-current density shown in FIG. 2.

FIG. 3 shows the intensity of multicusp magnetic fields measured at the same place as the saturated ion-current density shown in FIG. 2. The abscissa in FIG. 3 indicates the distance from inner wall surface 13b while the ordinate indicates the intensity of a magnetic field. As shown in FIG. 3, the intensity of the magnetic field is about 300 G at a position about 1 cm away from surface 13b of chamber 13 while the intensity at a position about 6 cm away from surface 13b is below 10 G.

Figure 4:
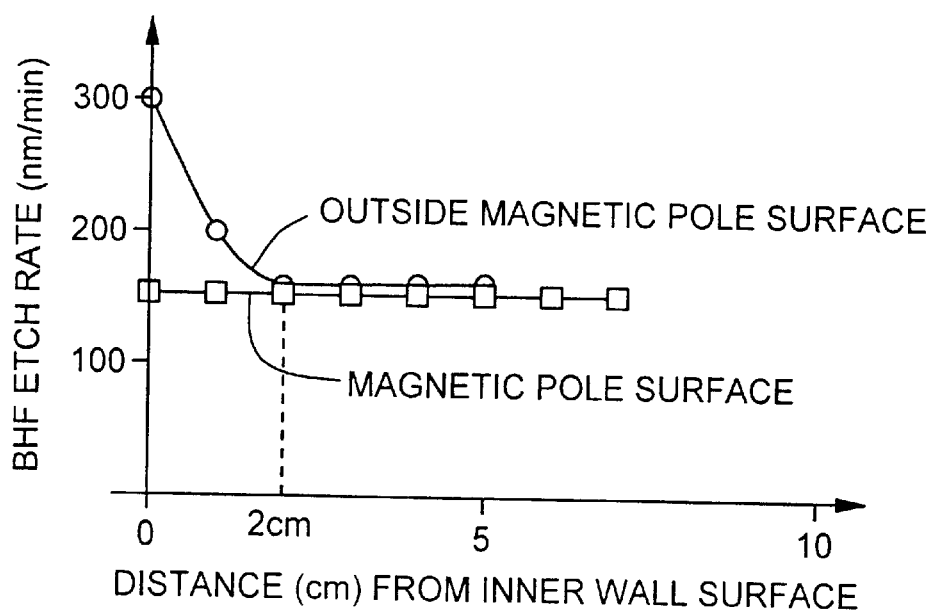
FIG. 4 is a graph showing the etching rates by buffer hydrofluoric acid (BHF) of the silicon dioxide films deposited and formed on a place corresponding to the pole surface of a permanent magnet for forming the multicusp magnetic field and on the one not corresponding to the pole surface measured at the same place as the saturated ion current density shown in FIG. 2.

FIG. 4 is a graph showing etching rates of buffer hydrofluoric acid (BHF) on silicon dioxide films deposited and formed in places 53 corresponding to the pole surfaces of permanent magnet 51 of magnetic field generation mechanism 14 for forming multicusp magnetic fields, and on those places 54 not corresponding to the pole surfaces measured in the same places as the saturated ion-current density shown in FIG. 3. In FIG. 4, the abscissa indicates the distance from inner wall surface 13b of film-forming chamber 13 while the ordinate indicates etching rates. A line C indicates data on samples deposited on places corresponding to the pole surfaces of the magnet 51 while a line D indicates data on samples deposited on places not corresponding to the pole surface. It is clear that as the rate of etching by means of buffer hydrofluoric acid becomes larger, the silicon dioxide films that are formed are rougher.

As shown in FIG. 4, line C shows that, irrespective of the distance from inner wall surface 13b of the film-forming chamber, the values of the etch rates are maintained constant at about 150 nm/min. As the etch rate of a thermal oxidated film is about 100 nm/min, it is understood that silicon dioxide films similar in quality to the thermal oxidated film are formed on the places corresponding to the pole surfaces of the permanent magnet 51 for forming multicusp magnetic :fields. On the other hand, line D shows that etch rates become larger at positions within a distance of 2 cm from the inner wall surface of the chamber, and the films formed are rougher.

From the graphs in FIGS. 2 to 4, it is understood that rough films are formed in the places on inner wall surface 13b of cylindrical wall part 13a of film-forming chamber 13 not irradiated with oxygen plasma while dense films are formed on those places irradiated with oxygen plasma. Thus, in the plasma-assisted CVD treating apparatus shown in FIG. 1, without any changes in arrangement of permanent magnet 51 of magnetic field generation mechanism 14 for forming multicusp magnetic fields, the radius of the inner wall surface of film-forming chamber 13 is made 2 cm shorter, ie., the inner diameter of the chamber is made 4 cm shorter.

A film-forming chamber having such a structure is used as a new film-forming chamber 113. As there is no change in the outer diameter (position of the outer wall surface) of chamber 113, cylindrical wall part 113a is made thicker. Use of a chamber 113 having such a form allows the oxygen plasma to contact the full surface of the inner wall of chamber 113. Thus, it has been found possible to densify all silicon dioxide films deposited and formed on wall surface 113b. The positions where the full surface of the inner wall can be brought into contact with oxygen plasma by reducing the diameter of inner wall surface 113b of chamber 113 correspond to areas having multicusp magnetic fields with an intensity below 200 G to be formed therein.

Figure 5:
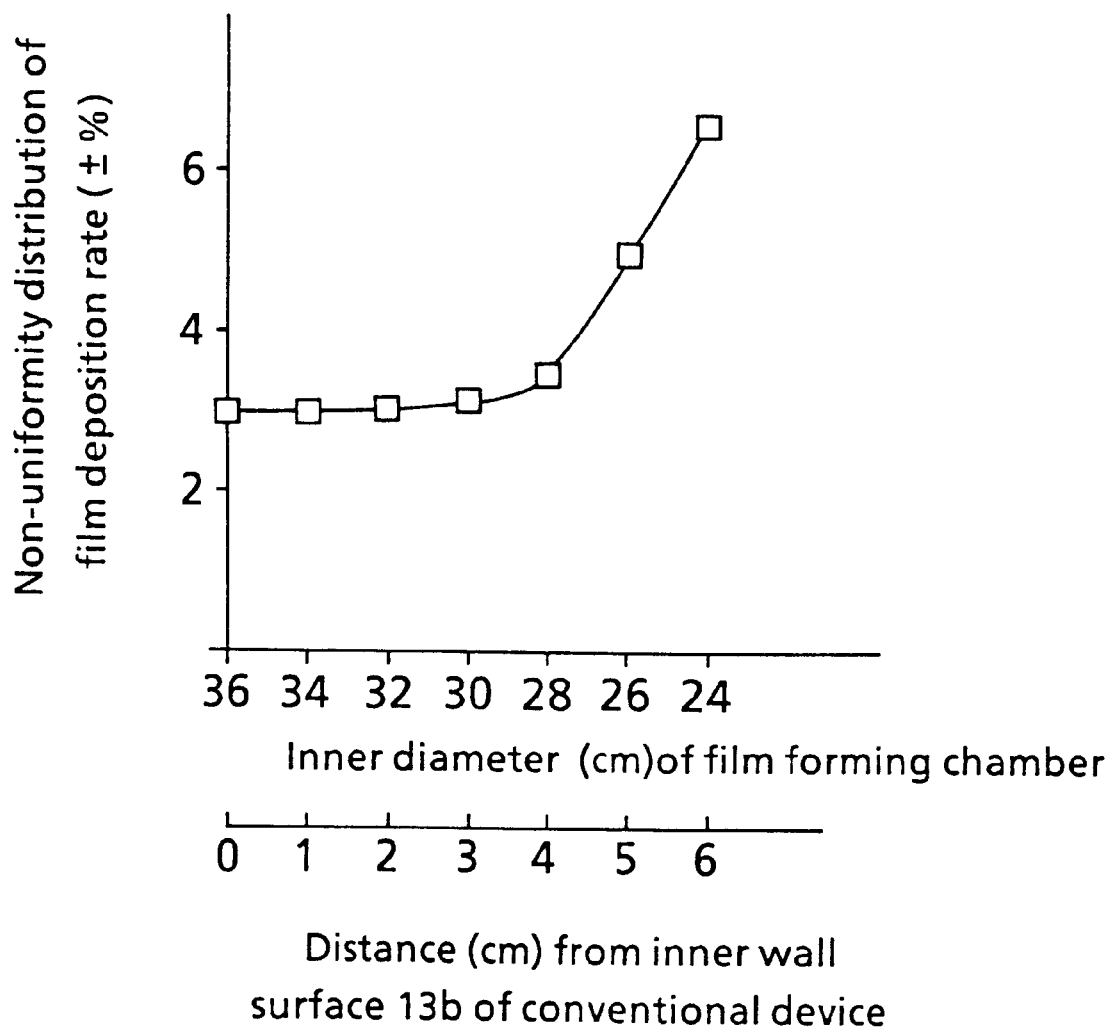
FIG. 5 is a graph showing the nonuniformity in film deposition rate distributions of substrates measured for each of the cases, wherein seven kinds of film-forming chambers are prepared with their inner diameters ranging from 24 to 36 cm, with a 2 cm difference between each for the conventional plasma treatment device for forming thin films.

FIG. 5 shows the result of measuring nonuniformity in the distribution of the film deposition rate of substrate 41 where silicon dioxide thin films are formed on an 8-inch substrate 41 using seven kinds of film-forming chambers having inner diameters ranging from 24 cm to 36 cm, i.e. a 2 cm difference between each of the conventional plasma-assisted CVD apparatus. In FIG. 5, the abscissa indicates the positions of the inner diameter of the film-forming chamber wherein the inner wall surface corresponds to the inner diameter. The ordinate indicates a nonuniformity in the distribution of the film deposition rate on the substrate. For example, when the inner diameter of the film-forming chamber is 36 cm, the position of the inner wall surface corresponds to 0 cm in the conventional device shown in FIG. 12, and when it is 24 cm, the position corresponds to 6 cm.

It is clear from FIG. 5, in the conventional plasma-assisted CVD apparatus, that when the inner diameter of the film-forming chamber is below 28 cm, that is, reduced by over 4 cm in size from the position of the inner wall surface, an adverse effect will occur to the uniformity of the rate of film deposition on the substrate. As compared with FIG. 3, the range of the adverse effect to the uniformity in film deposition rates corresponds to areas having multicusp magnetic fields with intensities of below 50 G to be formed inside the film-forming chamber.

From the results shown in FIGS. 2 to 5, it is clear that by arranging inner wall surface 113b of cylindrical wall part 113a of film-forming chamber 113 in areas having multicusp magnetic fields with an intensity of from 50 to 200 G formed therein, the uniformity in the quality of the silicon dioxide films deposited and formed on inner wall surface 113b and the uniformity in film deposition rate on substrate 41 can be improved simultaneously. Thus, it is predetermined that the inner wall surface 113b of film forming chamber 113 must be placed in areas having multicusp magnetic fields with an intensity of about 50 to 200 G to be formed therein.

A procedure for forming thin films by the plasma-assisted CVD apparatus in the first embodiment shown in FIG. 1 is described infra.

Oxygen gas, which is a gaseous starting material for plasma generation, is introduced to both bell jar 11 and film-forming chamber 123 by first gas-supplying mechanism 16. In bell jar 11, oxygen plasma is generated by applying high-frequency (RF) power from chamber 114 thereto and by the mutual reaction between oxygen gas molecules and the high frequency power. The oxygen plasma which is diffused from bell jar 11 into chamber 113 is made uniform in plasma density by a multicusp magnetic field formed in chamber 113 by magnetic field generation mechanism 14. Then, monosilane gas ($Si_{(4)}$), which is a gaseous material, is introduced into chamber 113 by second gas-supplying mechanism 17 and is diffused into the oxygen plasma. As the inside of chamber 113 is filled with the uniform oxygen plasma, the monosilane gas chemically reacts with the oxygen plasma and is decomposed into silicon dioxide and water. The generated silicon dioxide is then deposited on the surface of substrate 41 and the inner wall surface 113b of chamber 113.

In the plasma-assisted CVD apparatus of the first embodiment of the present invention, as inner wall surface 113b of cylindrical wall part 113a of film forming chamber 113 is located in the areas having multicusp magnetic fields with an intensity of from 50 to 200 G formed within the chamber, the oxygen plasma is uniformly brought into contact with surface 113b. As a result, dense silicon dioxide films are uniformly deposited and formed on the whole surface of the inner wall 113b of chamber 113. Hence, there is less possibility that the silicon dioxide films formed thereon will peel off even when the films become very thick because there are fewer changes in the internal stress. Accordingly, uniform contact of the oxygen plasma with the whole surface of the inner wall prevents generation of fine particulates. Further, even if the plasma-assisted CVD apparatus is operated for a long period of time, high quality silicon dioxide thin films can still be formed on substrate 41 with fewer surface flaws than with the conventional device.

Figure 6:
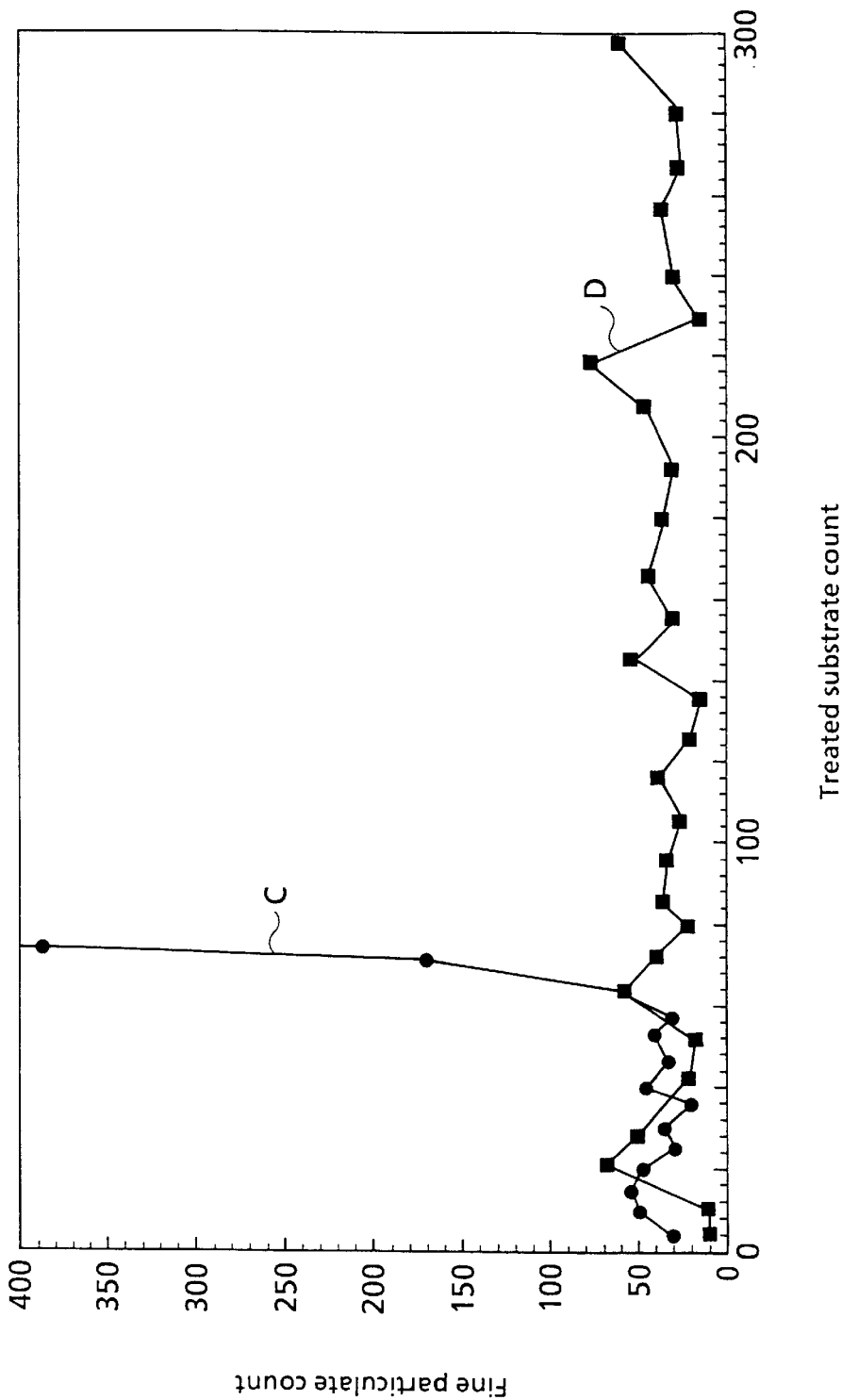
FIG. 6 is a graph showing changes in the amount of fine particulates on the surfaces of the semiconductor substrates wherein silicon dioxide thin films having a thickness of 1 $\mu$m are formed on a 6-inch silicon semiconductor substrate using oxygen gas as a plasma gaseous starting material and monosilane gas as a gaseous material.

FIG. 6 is a graph showing changes in the amount of fine particles on the surface of the treated semiconductor substrates on which silicon dioxide thin films are formed when a silicon dioxide thin film having a thickness of 1 $\mu$m is formed on a 6-inch silicon semiconductor substrate using oxygen gas as a plasma gaseous starting material and monosilane gas as a gaseous material. The fine particulates targeted for measuring were those having diameters of 0.3 $\mu$m on areas farther inside than the diameter 140 mm of the 6-inch silicon semiconductor substrate. In FIG. 6, a line E indicates measured characteristics using the conventional device while a line F indicates measured characteristics using the device of this embodiment. These films were produced under the following preferred conditions: a magnetic field intensity on the inner wall surface of approximately 70 gauss; a flow rate of SiH4 gas of 70 sccm; a flow rate of $O_2$ gas of 140 sccm; a pressure at film formation of 5 mTorr; a substrate temperature of 350° C.; a supplying power of 3 kW at 13.56 MHz; a biased power of 2 kW at 13.56 MHz; and a time for film formation of approximately 4 minutes (when the film thickness is 1.0 $\mu$m).

As shown on line E, the amount of fine particulates increases steeply from the range in which the number of treated semiconductor substrates is 70 reaching tens of thousands and exceeding 150. At this time, an inspection was made of the inner wall surface of the film forming chamber, and it was found that deposited films had peeled off the spots of the inner wall surface corresponding to the respective magnetic surfaces of a plurality of N and S poles of the permanent magnet 51 for forming multicusp magnetic fields. Thus, it can be understood that the peeling-off of the films deposited on the inner wall surface of the film-forming chamber causes a rapid increase of fine particulates.

On the other hand, as shown on line F for the present invention, the amount of fine particulates is below 100 until the number of treated semiconductor substrates reaches 300 . Again, an inspection was made of the inner wall surface of the film forming chamber at this time, and it was found that there had been no peeling-off of the films. Thus, by arranging the inner wall surface 113b of cylindrical wall part 113a of film forming chamber 113 in the areas having multicusp magnetic fields with an intensity of from 50 to 200 G the generation of fine particles can be suppressed.

Figure 7:
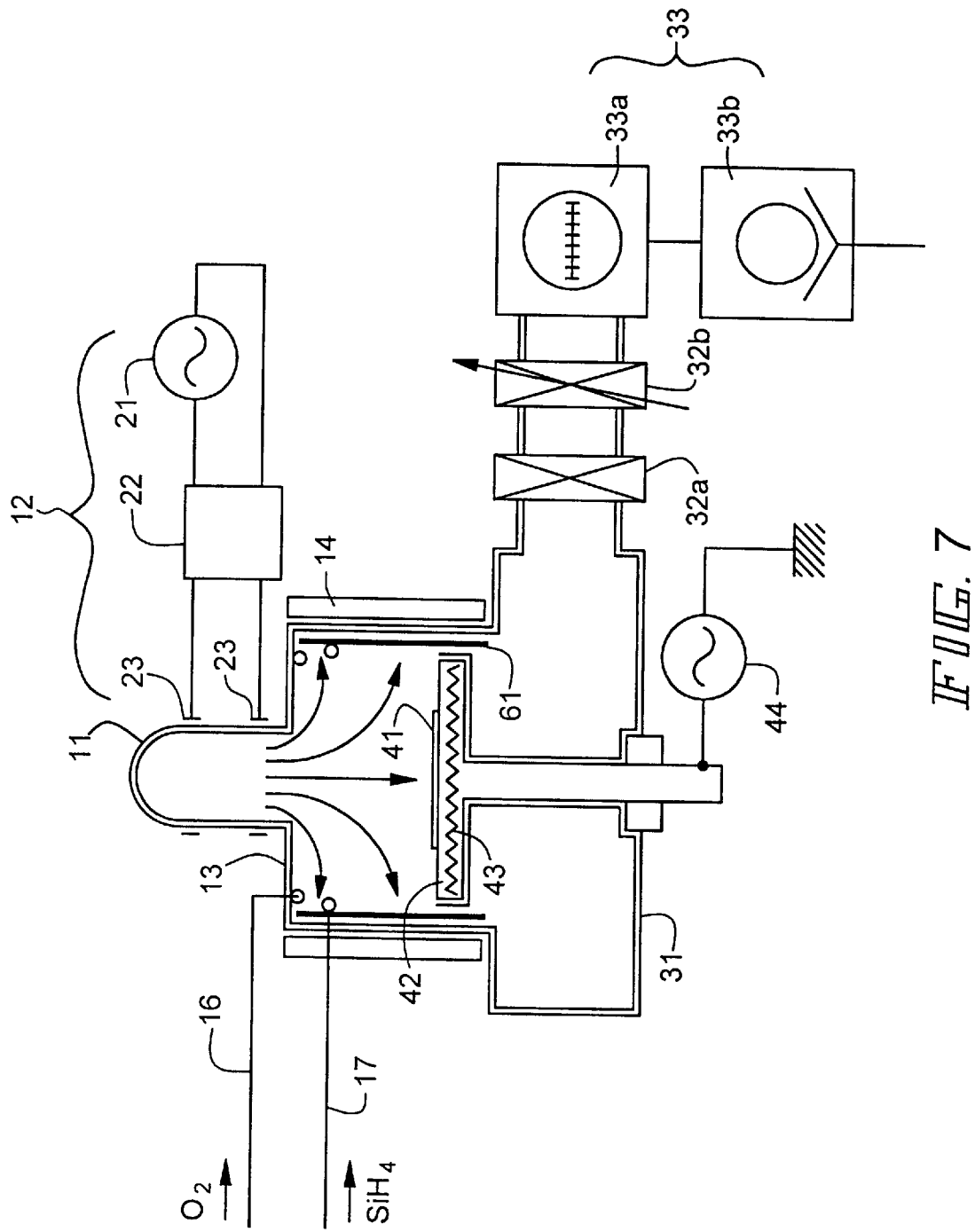
FIG. 7 is a sectional view showing the device of the second embodiment of the present invention.

FIG. 7 shows a second embodiment of the present invention. The same symbols and reference numbers are used in FIG. 7 to designate these substantially similar elements previously discussed for FIG. 1. In this embodiment, the film-forming chamber 13 of the conventional device is used, but in a space within chamber 13, a cylindrical member 61 made of a nonmagnetic material is arranged in areas having multicusp magnetic fields with an intensity of from 50 to 200 G. More specifically, it is enough for the inner surface of the cylindrical member 61 to be placed in the areas having multicusp magnetic fields of such intensity. Cylindrical member 61 is placed in parallel with the inner surface of cylindrical wall part 13a of chamber 13, and the length of its axial direction is almost equal to that of cylindrical wall part 13a. Nonmagnetic materials, such as aluminum, stainless steel or ceramic can be used in cylindrical member 61. By positioning cylindrical member 61 in the areas mentioned above instead of the inner wall surface 113b, the same effect as in the previous embodiment can be obtained in the plasma-assisted CVD apparatus of this embodiment.

Figure 8:
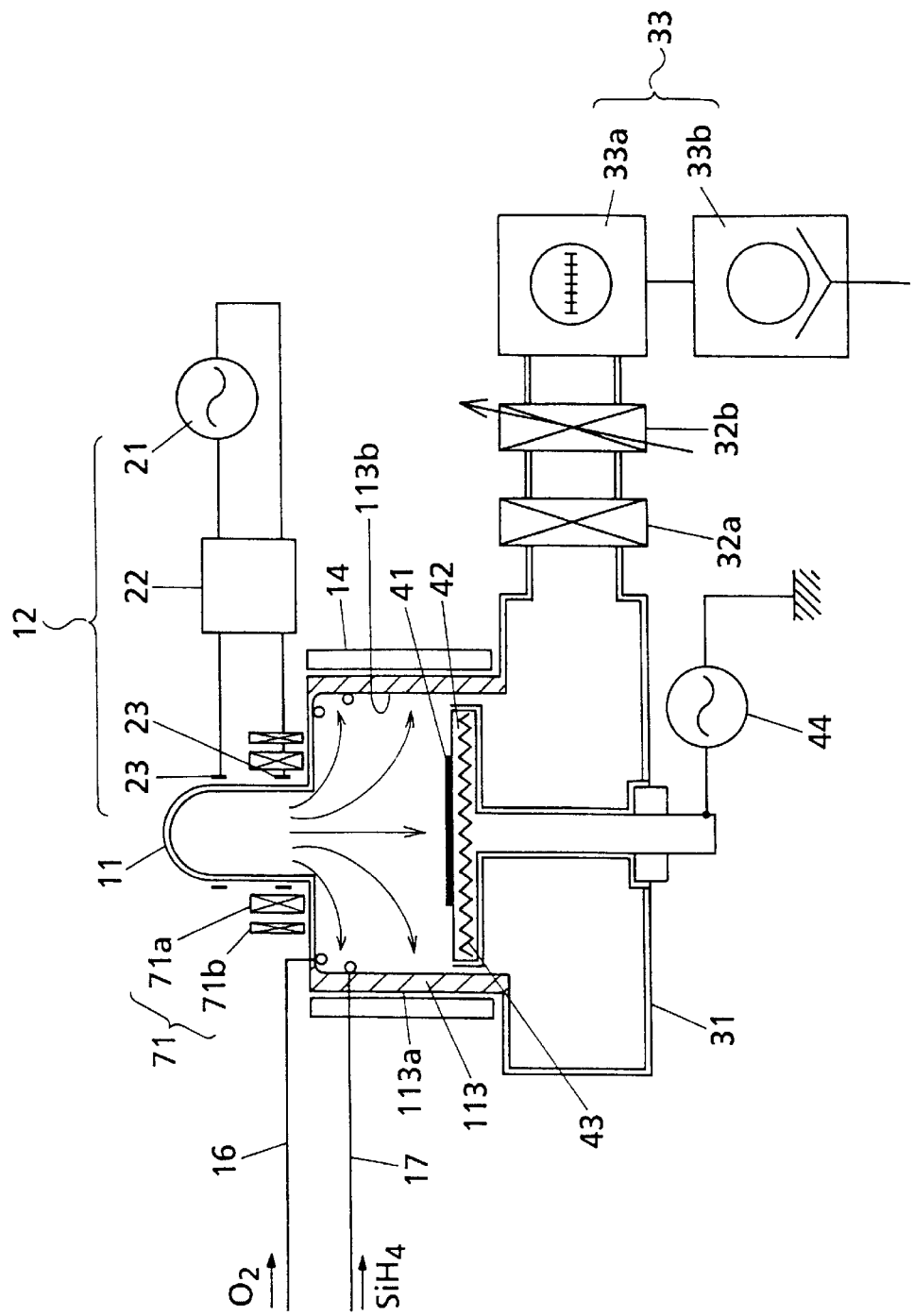
FIG. 8 is a sectional view showing the device of the third embodiment of the present invention.

FIG. 8 shows a third embodiment of the present invention. The plasma treatment device in this embodiment is similar to the one shown in FIG. 1 except that it includes a magnetic field generation mechanism 71 around bell jar 11.

Magnetic field generation mechanism 71 is a dual coil made of an inner coil 71a and an outer coil 71b, with coils 71a and 71b placed in positions coaxial to bell jar 11. The winding and electrically conductive directions for coils 71a and 71b are adjusted so that magnetic fields having opposing directions can be formed. The dual coil structure of magnetic field generation mechanism 71 makes it easier to form predetermined magnetic fields. It is possible as well to construct mechanism 71 with a single coil. When magnetic fields are generated by supplying electricity to mechanism 71, it is possible to efficiently transfer charged particles in the plasma generated within bell jar 11 to the inside of film forming chamber 113. This transfer of charged particles helps increase the plasma density to a high level within film-forming chamber 113.

Figure 9:
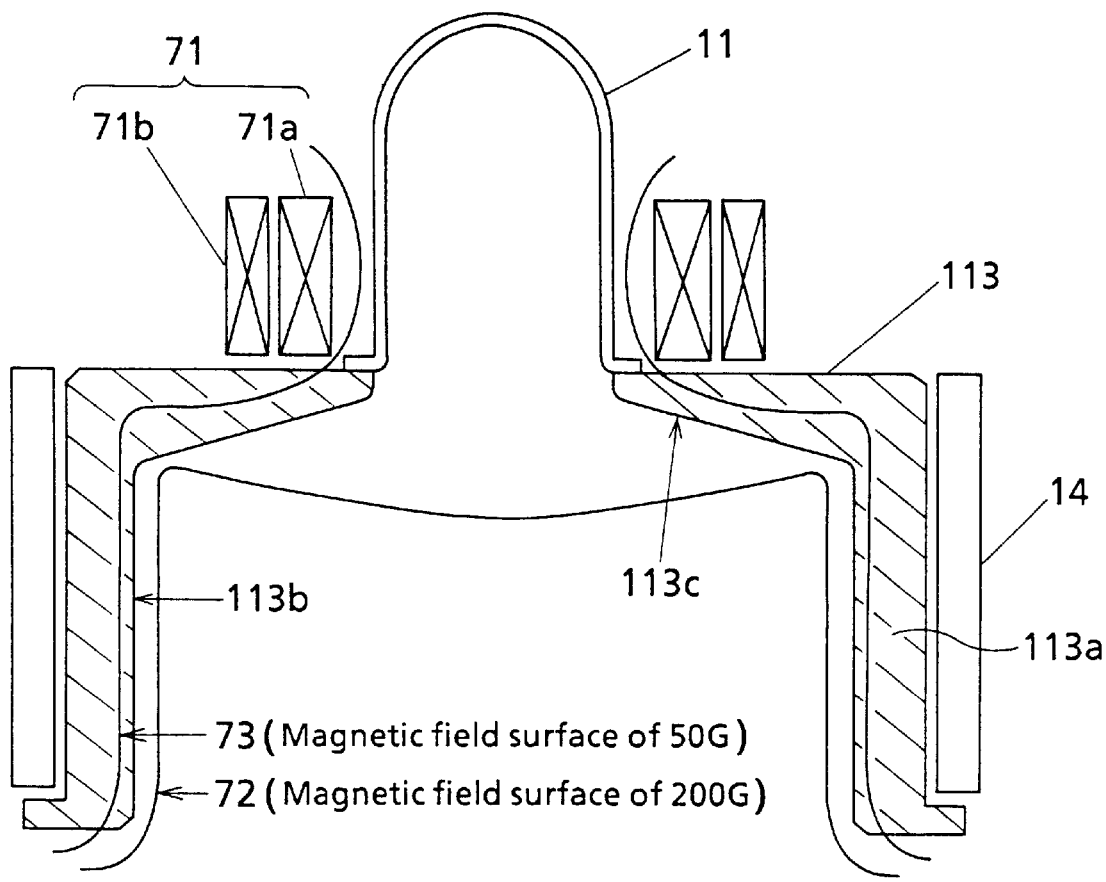
FIG. 9 is an enlarged sectional view showing the film forming chamber of the third embodiment of the present invention.

A new magnetic field, different from a multicusp magnetic field, will also be generated inside film-forming chamber 113 by magnetic field generation mechanism 71. FIG. 9 shows the magnetic field distribution generated inside chamber 113 when a current of 15 A is supplied to inner coil 71a and a current of 10 A is supplied to outer coil 71b in the magnetic field generation mechanism 71. In FIG. 9, reference number 72 indicates a magnetic field surface having an intensity of 50 G while reference number 73 indicates a magnetic field surface having an intensity of 200 G. It can be seen that the areas having a magnetic field intensity ranging from 50 to 200 G are spreading through the ceiling surface of chamber 113 to a certain distance therefrom.

Thus, for the resulting magnetic field made by overlapping a magnetic field from magnetic field generation chamber 71 provided around bell jar 11 and a multicusp magnetic field, inner wall surface 113b, including ceiling surface 113c (see FIG. 9) of chamber 113, is located in the areas having a magnetic field intensity of from 50 to 200 G. In this embodiment, the ceiling part of chamber 113 is thickly formed, and ceiling surface 113c is placed in the areas having a magnetic field intensity of from 50 to 200 G. Surface 113c is included in the inner wall surface. Such a construction will prevent for a long period of time the generation of fine particulates from the films being deposited on inner wall surface 113b.

Figure 10:
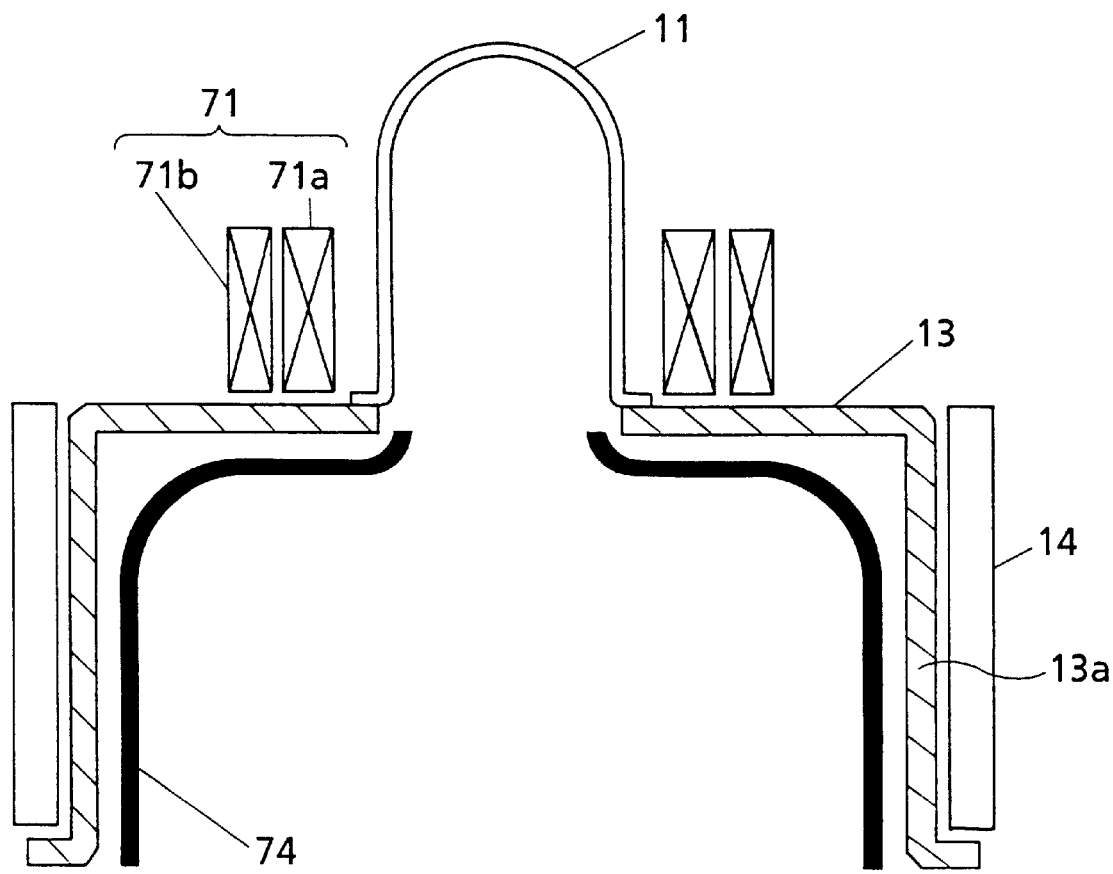
FIG. 10 is an enlarged sectional view showing the film forming chamber of the fourth embodiment of the present invention.
Figure 11:
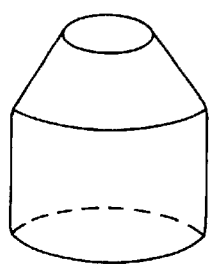
FIG. 11 is a view showing various examples of the members made of nonmagnetic materials.
Figure 11:
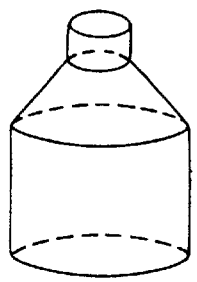
Figure 11:
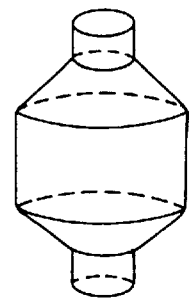
Figure 11:
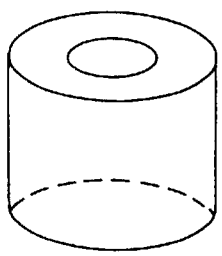
Figure 11:
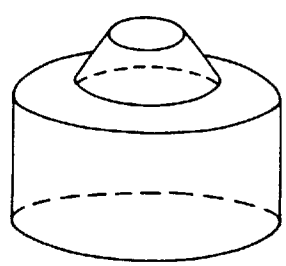

FIG. 10 shows a fourth embodiment of the present invention with the view similar to that in FIG. 9. In this embodiment, a film-forming chamber 13 which is similar to the conventional type of chamber is used. A cylindrical member 74, formed of a nonmagnetic material, is set in one of the areas having a magnetic field intensity of from 50 to 200 G formed from overlapping magnetic fields generated by magnetic field generation mechamism 71 and multicusp magnetic fields. (Hence, instead of inner wall surface 113b in the third embodiment, cylindrical member 74 is placed in chamber 13. As shown in FIGS. 11 (A)–(E), the form of the cylindrical member can be selected from: a combination of a cylindrical body and a truncated cone, a bottomed cylinder, or a combination of a bottomed cylindrical body and a truncated cone. As member 74 can be manufactured at a low cost, the economic value of the plasma treatment device of the present invention is increased.

Cylindrical members 61 and 74 must be set in an electrically insulated state, and the function for applying high-frequency power can be added. Accordingly, plasma can be added to members 61 and 74, and silicon dioxide films deposited and stuck to these members can be removed by sputter-etching. Thus, silicon dioxide films deposited and stuck to member 61 and 74 can be removed by sputter-etching the films deposited thereon, a source for generating fine particulates can also be rooted out. Consequently, silicon dioxide thin films having fewer surface flaws are formed on the substrate for a longer period of time.

As detailed above, the embodiments of the present invention are advantageous in that they prevent the generation of fine particulates which would otherwise reduce the quality of silicon dioxide thin films formed on the surface of a substrate.

In the above description, reference was made to a situation where silicon dioxide thin films are formed on a 6-inch silicon semiconductor substrate. However, the present invention can also be used when substrates of different types and sizes are used.

Further, when other thin films are formed, e.g. by changing the type of gaseous starting materials and gaseous materials for plasma generation, the present invention can still be used to prevent the generation of fine particulates. For example, the present invention can be used to prevent the generation of fine particulates during the formation of silicon nitride thin films using nitrogen gas as a gaseous starting material and disilane gas as a gaseous material.

The present invention can be used with a plasma-etch treatment device for treating substrate materials by etching. In this device, instead of a film-forming chamber, an etching chamber is used. Conceptually, both film-forming and etching chambers are included in the treating chamber.

For plasma-etching treatment, products generated by the etching reaction between the plasma and the substrate materials are deposited on the inner wall surface of the etching chamber, and, similar to the film-forming device, a difference in internal stress among deposited films is generated depending on the existence of plasma irradiation. As a result, sooner or later, the films will peel off, fine particulates will be produced, and the quality of the films will deteriorate forming surface flaws on the substrate. However, by using the present invention, it is possible to form films that are dense and uniform in quality on the inner wall surface, and thereby prevent the generation of fine particulates and operate the etch treatment with fewer surface flaws.

As is clear from the description above, in the present invention, as the inner wall surface of the treating chamber is arranged in an area having a multicusp magnetic field or a resulting magnetic field with an intensity of from 50 to 200 G, which is made by overlapping a multicusp magnetic field and a magnetic field formed by the other magnetic field generation mechanism, the whole surface of the inner wall is brought into the plasma, uniform films will be formed thereon and the generation of fine particulates is prevented, and internal stresses are made uniform which results in the formation of high-quality thin films with fewer surface flaws in the etching operation.

Alternately, a member made of a nonmagnetic material is arranged in the area having an intensity of from 50 to 200 G of a magnetic field instead of the inner wall surface of the treating chamber, and an effect similar to that mentioned above can be obtained. Further, it is possible to make a member having a simple construction and at a low cost without needing to change the form of the treating or film-forming chamber itself.

What is claimed is:

1. A plasma treatment device comprising:

a plasma generation chamber;

a power-supplying mechanism for supplying power to said plasma generation chamber;

a first gas supplying mechanism for supplying gaseous starting materials for plasma generation;

a film-forming chamber spatially coupled to said plasma generation chamber for receiving plasma from said plasma generation chamber, said film-forming chamber having a cylindrical wall part within said film-forming chamber and an inner wall surface arranged inside said cylindrical wall part;

a magnetic field generation mechanism located around said film-forming chamber for forming a multicusp magnetic field in said film-forming chamber;

a second gas supplying mechanism for supplying gaseous materials for forming films;

an evacuation mechanism for evacuating said plasma generation and film-forming chambers;

wherein said inner wall surface of said film-forming chamber is located in an area having a multicusp magnetic field with an intensity of from approximately 50 to 200 G so as to produce dense and uniform films.

2. The plasma treatment device according to claim 1 further comprising a second magnetic field generation mechanism located around said film-forming chamber for forming a magnetic field in said film-forming chambers wherein said inner wall surface of said film-forming chamber is arranged in an area having a resulting magnetic field with an intensity of from approximately 50 G to 200 G made by said multicusp magnetic field and said magnetic field from said second magnetic field generation mechanism.

3. The plasma treatment device according to claim 2 wherein said second magnetic field generation mechanism comprises an inner coil and an outer coil located coaxial to said plasma generation chamber.

4. The plasma treatment device according to claim 2 wherein said inner wall surface of said film-forming chamber further comprises a ceiling surface located in said resulting magnetic field having an intensity of from approximately 50 G to 200 G for forming films on said ceiling surface.

5. A plasma treatment device comprising:

a plasma generation chamber;

a power-supplying mechanism for supplying power to said plasma generation chamber;

a first gas supply mechanism for supplying gaseous starting materials for plasma generation;

a film-forming chamber spatially coupled to said plasma generation chamber for receiving plasma from said plasma generation chamber;

a cylindrical member formed of a nonmagnetic material located within said film-forming chamber;

a magnetic field generation mechanism located around said film-forming chamber for forming a multicusp magnetic field in said film-forming chamber;

an evacuation mechanism for evacuating said plasma generation and film-forming chambers;

a second gas-supplying mechanism for supplying gaseous materials for forming films;

wherein said cylindrical member is arranged in an area having a multicusp magnetic field with an intensity of from approximately 50 to 200 G so as to produce dense and uniform films.

6. The plasma treatment device according to claim 5, wherein said cylindrical member is formed of a cylindrical member and a truncated cone member.

7. The plasma treatment device of claim 5 wherein said cylindrical member is formed of a bottomed cylinder.

8. The plasma treatment device of claim 5 wherein said cylindrical member is formed of a bottomed cylindrical member and a truncated cone member.

9. The plasma treatment device according to claim 5, wherein said cylindrical member is formed of a nonmagnetic material selected from the group consisting of aluminum, stainless steel and ceramic.

10. The plasma treatment device according to claim 5, further comprising a second magnetic field generation mechanism located around said film-forming chamber for forming a magnetic film in said film-forming chamber, wherein said cylindrical member is arranged in an area having a resulting magnetic field with an intensity of from approximately 50 G to 200 G made by said multicusp magnetic field and said magnetic field from said second magnetic field generation mechanism.

11. The plasma treatment device according to claim 10 wherein said second magnetic field generation mechanism comprises an inner coil and an outer coil located coaxial to said plasma generation chamber.

12. The plasma treatment device according to claim 10 wherein said inner wall surface of said film-forming chamber further comprises a ceiling surface located in said resulting magnetic field having an intensity of from approximately 50 G to 200 G for forming films on said ceiling surface.

13. A plasma treatment device comprising:

a plasma generation chamber;

a power-supplying mechanism for supplying power to said plasma generation chamber;

a first gas supplying mechanism for supplying gaseous starting materials for plasma generation;

a film-forming chamber spatially coupled to said plasma generation chamber for receiving plasma from said plasma generation chamber, said film-forming chamber having a cylindrical wall part within said film-forming chamber and an inner wall surface arranged inside said cylindrical wall part;

a magnetic field generation mechanism located around said film-forming chamber for forming a multicusp magnetic field in said film-forming chamber;

a second magnetic field generation mechanism located around said film-forming chamber for forming a magnetic field in said film-forming chamber;

a second gas supplying mechanism for supplying gaseous materials for forming films;

an evacuation mechanism for evacuating said plasma generation and film-forming chambers;

wherein said inner wall surface of said film-forming chamber is located in an area having a resulting magnetic field with an intensity of from approximately 50 G to 200 G made by said multicusp magnetic field and said magnetic field from said second magnetic field generation mechanism so as to produce dense and uniform films.

14. The plasma treatment device according to claim 13 wherein said second magnetic field generation mechanism comprises an inner coil and an outer coil located coaxial to said plasma generation chamber.

15. The plasma treatment device according to claim 13 wherein said inner wall surface of said film-forming chamber further comprises a ceiling surface located in said resulting magnetic field having an intensity of from approximately 50 G to 200 G for forming films on said ceiling surface.

16. A method for forming silicon dioxide films comprising the steps of:

introducing oxygen gas to a plasma generation chamber and a film-forming chamber spatially coupled to said plasma generation chamber;

applying high-frequency power to said plasma generation chamber to generate oxygen plasma;

applying a multicusp magnetic field to said film-forming chamber;

diffusing said oxygen plasma from said plasma generation chamber to said film-forming chamber;

uniformly bringing said oxygen plasma in said film-forming chamber into contact with an inner wall surface of a cylindrical wall part of said film-forming chamber, wherein said inner wall surface is located in areas having multiple magnetic fields with an intensity of approximately 50 to 200 G;

introducing monosilane gas to said film-forming chamber, said monosilane gas reacting with said oxygen plasma to form silicon dioxide and water; and depositing silicon dioxide films on a substrate.

\* \* \* \* \*